United States Patent
Kato

(10) Patent No.: US 6,265,674 B1
(45) Date of Patent: *Jul. 24, 2001

(54) TERMINAL CONNECTING STRUCTURE OF FLEXIBLE BOARD AND PRINTED CIRCUIT BOARD

(75) Inventor: Koichi Kato, Fukushima-ken (JP)

(73) Assignee: Alps Electric Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/664,064

(22) Filed: Jun. 13, 1997

(30) Foreign Application Priority Data

Jun. 29, 1995 (JP) .................................... 7-164065

(51) Int. Cl.$^7$ ....................................... H01R 9/09
(52) U.S. Cl. .......................... 174/261; 361/803; 439/66; 439/74; 439/78
(58) Field of Search .................... 174/254, 261, 174/268; 361/803, 787, 789, 790; 439/67, 493, 66, 68, 74, 78, 83, 77, 943

(56) References Cited

U.S. PATENT DOCUMENTS

| | | | |
|---|---|---|---|
| 4,466,184 | * 8/1984 | Cuneo et al. | 439/67 X |
| 5,192,214 | * 3/1993 | Samarov et al. | 439/67 |

FOREIGN PATENT DOCUMENTS

| | | | |
|---|---|---|---|
| 62-76477 | 5/1987 | (JP) . | |
| 1-204374 | * 8/1989 | (JP) | 439/67 |
| 5-166576 | * 7/1993 | (JP) . | |
| 5-206627 | * 8/1993 | (JP) . | |

OTHER PUBLICATIONS

"High Density Field Replaceable Flexible Circuit Connector" IBM Technical Disclosure Bulletin, Aug. 1991 vol. 34, No. 3 pp. 153–155.*

* cited by examiner

Primary Examiner—Albert W. Paladini
(74) Attorney, Agent, or Firm—Brinks Hofer Gilson & Lione

(57) ABSTRACT

A terminal connecting structure between flexible board and printed circuit board for securely making connections thereof at a low cost. Width dimension W of each land portion 13a of a copper foil pattern 13 provided on a printed circuit board 10 is set to W=0.4 mm, and solders 15 are formed on the surface of the land portions 13a using a dip method. A flexible board 7 is placed on the printed circuit board 10 and the flexible board 7 is urged toward the printed circuit board 10 by an elastic member 5 so as to press each connecting terminal 9a of a circuit pattern 9 provided on the flexible board 7 into contact with the solder 15 of respective land portion 13a. By setting width dimension of each land portion to 0.6 mm or less and adhering solder to the surface thereof using a dip method, dispersion in height dimension among the solders becomes smaller.

6 Claims, 4 Drawing Sheets

TERMINAL CONNECTING STRUCTURE OF FLEXIBLE BOARD AND PRINTED CIRCUIT BOARD

BACKGROUND OF THE INVENTION

1. Field of the Invention

The present invention relates to a terminal connecting structure of a flexible board and a printed circuit board, and more particularly relates to a terminal connecting structure of the type for pressing a connecting portion of a flexible board into contact with a land portion of a printed circuit board to make connection thereof.

2. Description of the Related Art

In a connecting structure employed for example in a keyboard input device, a membrane sheet (flexible board) is used as a switching device to be operated by a depression of each keytop, thereby electrically connecting an output part of the membrane sheet and a printed circuit board that mounts circuit component parts.

In the known connecting structure of this type, an exclusive connector having a plurality of clip-like contacting elements is soldered onto the printed circuit board so that terminals of the two boards are conductive through the contacting elements by inserting an end portion of the membrane sheet into the connector. Since, however, such connector requires the plurality of clip-like contacting elements and an insulating case for containing these elements, a complicated structure is unavoidable and a higher cost results.

On the other hand, the terminal connecting structure of flexible board and printed circuit board proposed by the present applicant in Japanese Utility Model Laid-Open Publication No.62-76477 includes a holding member fixed to the printed circuit board and flexible board through an elastic sheet. The respective terminals of the printed circuit board and flexible board are pressed into contact with each other by the elastic sheet so as to conduct electricity. In this construction, since the terminal on the printed circuit board and the terminal on the flexible board are pressed into contact with each other by the resilient force from the elastic sheet, a high-priced exclusive connector can be omitted to achieve a reduction in cost.

If, however, the corresponding terminals on the flexible board are brought into direct contact with the respective terminals on the printed circuit board in the terminal connecting structure of the conventional pressure-connected type as described, a sufficient contacting pressure cannot be secured because the respective terminals come into contact at their flat surface. Although a method may thus be considered of increasing the contacting pressure by previously applying solder to land portion of each terminal of the printed circuit board and bringing the terminal on the flexible board into contact with a curved surface of the solder, the height dimension of each solder tends to vary when such soldering is performed by a dip method and a new problem occurs that the state of contact becomes unstable at the portion where the solder height is low.

SUMMARY OF THE INVENTION

In view of the conventional art as described, it is an object of the present invention to provide a terminal connecting structure of a flexible board and a printed circuit board which is inexpensive and securely makes connection.

The present invention achieves the above object by setting the width dimension of each land portion of a copper foil pattern provided on the printed circuit board to 0.6 mm or less, previously adhering solder to these land portions and pressure-bonding each connecting portion provided on the flexible board to the solder of said land portion.

Further, in the above construction, the land portions of said printed circuit board are arranged in a zigzag pattern.

As a result of a study on the cause of dispersion in the height dimension of the solder which has been dip-soldered to each land portion, the present inventors have found that the height dimension of the solder is greatly varied by the width dimension of the land portion and have decided to set the width dimension of each land to 0.6 mm or less and preferably to about 0.4 mm. When, as described, solder is applied by means of a dip method to a thin land portion having a width dimension of 0.6 mm or less, dispersion in the height dimension among the solders becomes less, though the solder height becomes smaller due to the fact that the adhered amount of the solder is reduced. As a result, the solder height to be applied to each land portion of the printed circuit board is uniform and each terminal on the flexible board may be securely pressed into contact with respective solder at a high contacting pressure.

BRIEF DESCRIPTION OF THE DRAWING

FIG. 7 is a graph that illustrates explains the relationship between land width W and solder height H of the land portion 13a.

DESCRIPTION OF THE PREFERRED EMBODIMENT

An embodiment of the present invention will now be described by way of the drawings.

Figure 1:
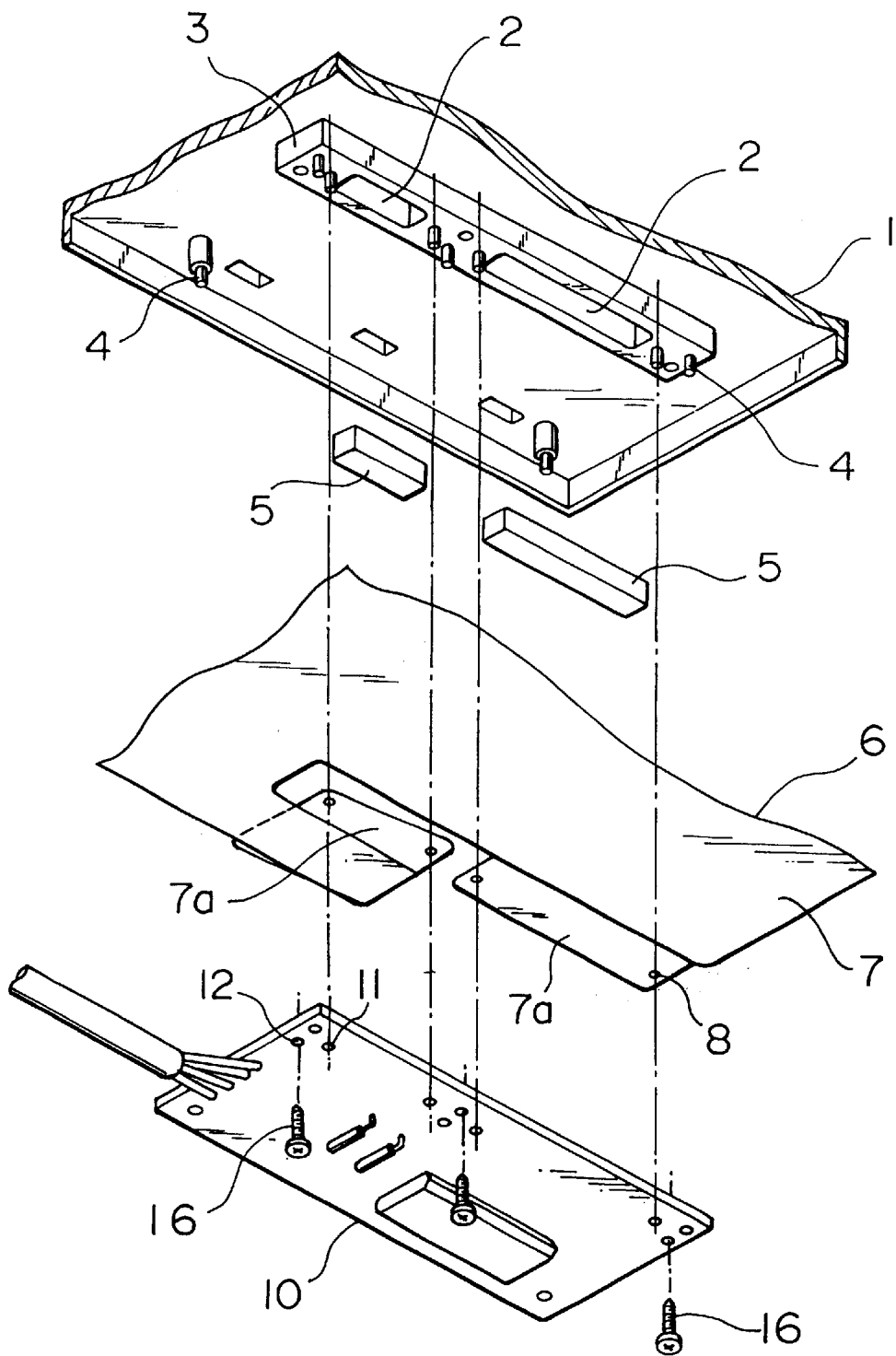
FIG. 1 is an exploded perspective view showing the terminal connecting structure of flexible board and printed circuit board according to an embodiment of the present invention.
Figure 2:
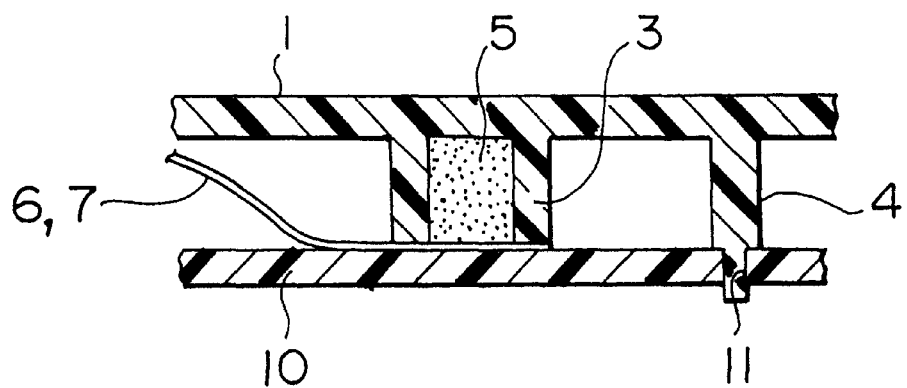
FIG. 2 is a sectional view of certain portions of the terminal connecting structure.
Figure 3:
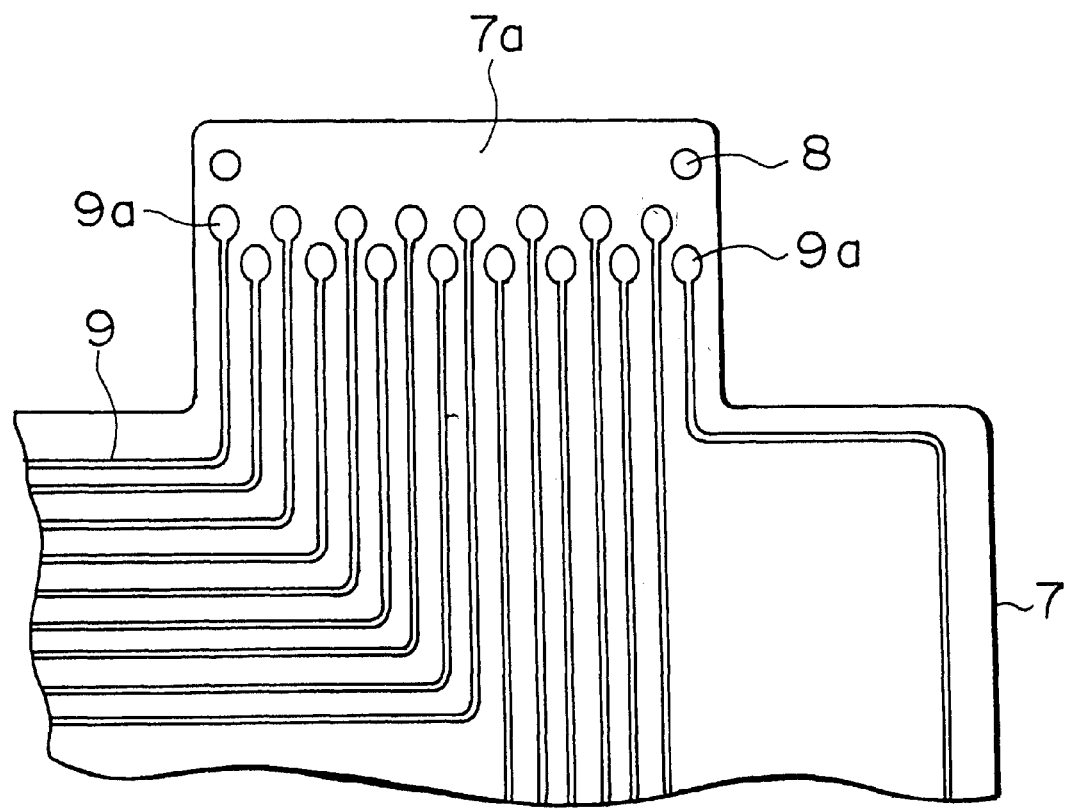
FIG. 3 is a back view of a flexible board included in the terminal connecting structure.
Figure 4:
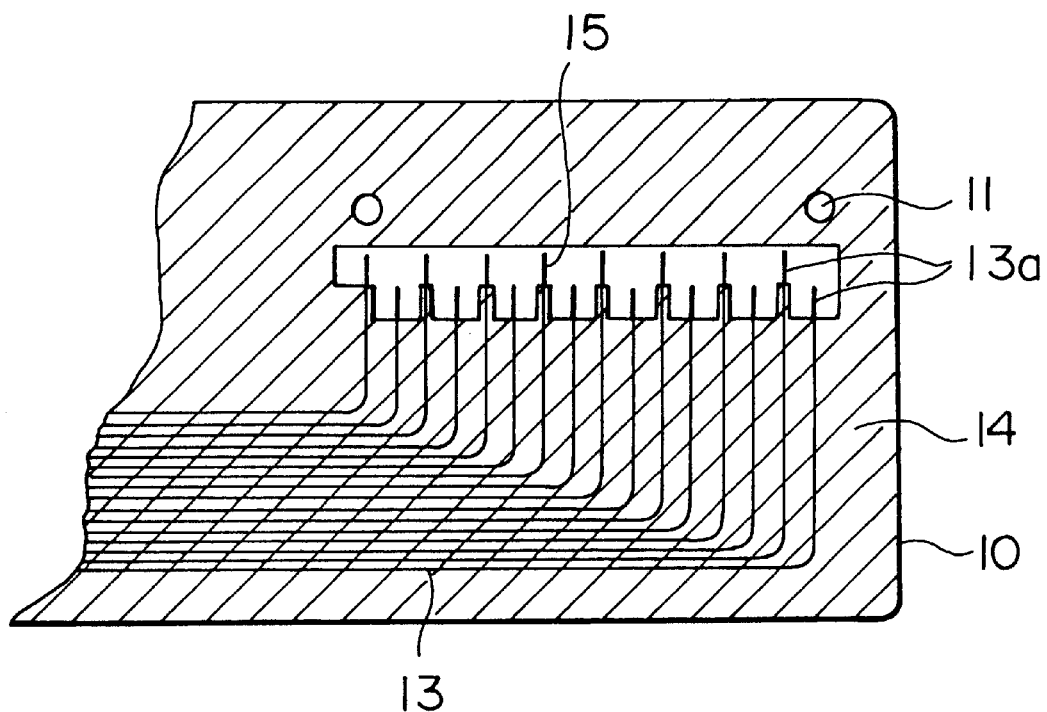
FIG. 4 is a plan view of a printed circuit board included in the terminal connecting structure.
Figure 5:
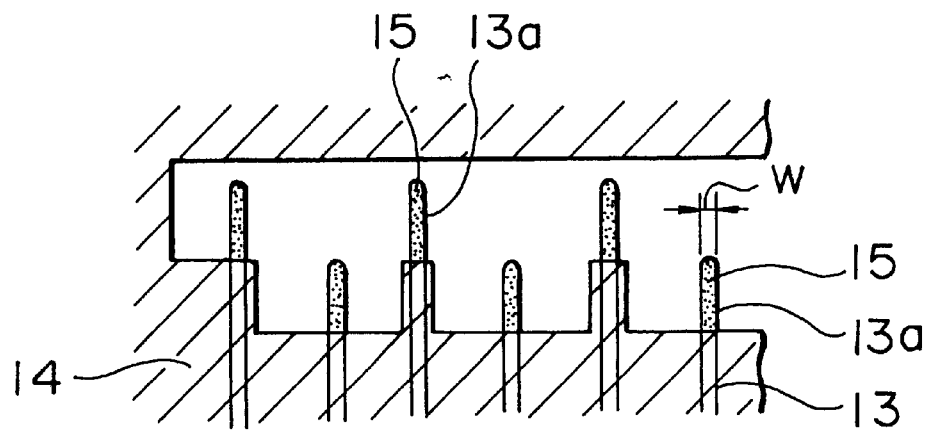
FIG. 5 illustrates land portions of the printed circuit board.
Figure 6:
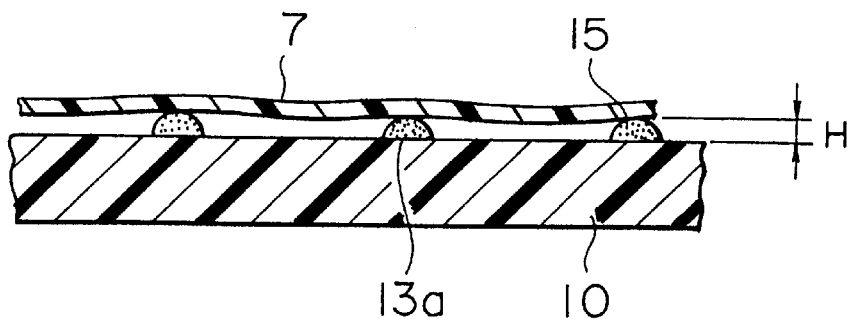
FIG. 6 illustrates solder to be adhered to the land portions.

FIG. 1 is an exploded perspective view showing the terminal connecting structure between a flexible board and a printed circuit board according to an embodiment of the present invention; FIG. 2 is a sectional view of certain portions of the terminal connecting structure; FIG. 3 is a back side view of the flexible board included in the terminal connecting structure; FIG. 4 is a plan view of the printed circuit board included in the terminal connecting structure; FIG. 5 illustrates the land portions of the printed circuit board; and FIG. 6 illustrates solder to be laid and adhered onto the land portion.

A housing 1 for forming an outer shell of a keyboard input device or the like includes on the back surface thereof a projection 3 having a recess 2 and a plurality of locating pins 4. An elastic member 5 made of a sponge or the like is contained in said recess 2 such that the elastic member 5 in its unpressed state projects from a lower surface of the projection 3. A membrane sheet 6 is constituted by a pair of flexible boards 7 which are laminated through a spacer film (not shown) and has a plurality of locating holes 8. The flexible board 7 is formed from a film material having a flexibility such as PET or polyimide. As shown in FIG. 3, circuit patterns 9 made of silver paste or the like are formed on the flexible board 7. The circuit patterns 9 are aggregated into an output part 7a which is formed on the flexible board 7 in the manner of a projection, connecting terminals 9a of the circuit patterns 9 at the output part 7a being arranged in two rows so as to form a zigzag pattern.

A printed circuit board 10 has a plurality of locating holes 11 and screw insertion holes 12 formed therein and various electronic component parts such as capacitor and IC soldered thereon. As shown in FIG. 4, a copper foil pattern 13 is provided on a surface of the printed circuit board 10, and the portion of the copper foil pattern 13 except for land portions 13a is covered with a resist layer 14. As shown in FIGS. 5 and 6, while the land portions 13a are arranged in two rows forming a zigzag pattern corresponding to the contacting terminals 9a, all of these are the same in their width dimension W. Further, the surface of each land portion 13a is covered with solder 15 having a height dimension H, the solder 15 being formed by a dip method where the printed circuit board 10 is dipped into a fused solder.

As shown in FIGS. 1 and 2, the membrane sheet 6 is placed on said printed circuit board 10, and screws 16 are inserted into the screw inserting holes 12 to incorporate the printed circuit board 10, membrane sheet 6 and the housing 1 into one member. At this time, the elastic member 5 contained within the recess 2 of the housing 1 is compressed until it is brought into the same plane as the lower end of the projection 3 so that, due to the resilient force from the elastic member 5, the contacting terminals 9a of the circuit pattern 9 formed on the output part 7a of the flexible board 7 are pressed into contact with the solder 15 which has previously been adhered to the respective land portions 13a of the printed circuit board 10. Further, the relative position of the respective connecting terminals 9a and solders 15 at this time are accurately determined as the locating hole 8 of the membrane sheet 6 and the locating hole 11 of the printed circuit board 10 are fitted onto the locating pins 4 of the housing 1.

In the terminal connecting structure of the flexible board 7 and printed circuit board 10 constructed in this manner, it is important to make smaller the dispersion in the height dimension H of the solder 15 adhered to the land portion 13a in order to secure the state of contact between the respective connecting terminals 9a and solders 15. In other words, as the difference in solder height H (difference in step) between neighboring solders 15 is increased, the resilient force of the elastic member 5 cannot be uniformly exerted on the both solders 15 through the flexible board 7. A sufficient contacting force is not acted upon between the lower solder 15 and the connecting terminal 9a facing thereto and the contacting state at that portion becomes unstable.

Figure 7:
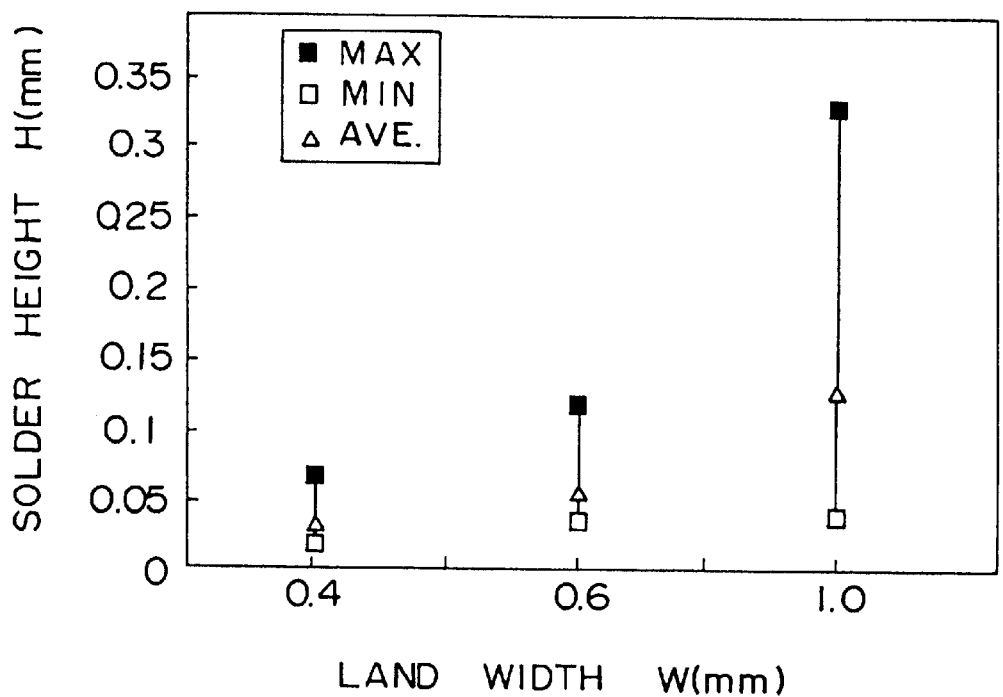

FIG. 7 illustrates the relationship between land width W and solder height H of the land portion 13a. As is apparent from this figure, while the dispersion in solder height H is large or 0.03 to 0.33 mm (a difference in step of 0.3 mm) for the case where the land width is 1 mm, the dispersion in solder height H is significantly smaller or 0.03 to 0.13 mm (a difference in step of 0.1 mm) when land width W is 0.6 mm. In this manner, the dispersion in height dimension H of the solder 15 largely depends on the land width W of the land portion 13a and the dispersion in solder height H becomes significantly smaller if the land width W is 0.6 mm or less. Here, the case of defect due to a discontinuation of the pattern at the land portion 13a is also a consideration. The land width W is thus determined to be 0.4 mm in the present embodiment. As a result, the solder height H of each solder 15 is uniformed to 0.02 to 0.07 mm (a difference in step of 0.05 mm). The connecting terminals 9a are pressed into contact with the respective solders 15 at a high contacting pressure by the resilient force from the resilient member 5 so that the circuit pattern 9 of the flexible board 7 can be securely brought into electrically conductive state through the copper foil pattern 13 of the printed circuit board 10. Further, in the present embodiment, since the land portions 13a of the printed circuit board 10 are arranged in two rows forming a zigzag pattern, the pitch between neighboring two land portions 13a is expanded to two times with respect to each row comparing to the case where the land portions 13a are arranged in a single row. As a result, it is easier to cause the flexible board 7 to follow the respective solders 15. This also makes it possible to stabilize the connecting state of the connecting terminals 9a and solders 15.

In the above described embodiment, the flexible board 7 of the membrane sheet 6 is shown as an example of the member to be connected to the printed circuit board 10. However, the present invention may also be applied to other terminal connecting structures between a flexible board and a printed circuit board. For example, it can be applied to the case where a flexible board for use as a lead brought out from an LCD or the like is to be connected to a printed circuit board.

As has been described above, according to the present invention, the height of solder applied on each land portion of the printed circuit board is uniformed. The terminals on the flexible board may thus be securely pressed into contact with the respective solders at a high contacting pressure using a simple construction where the flexible board is resiliently urged toward the printed circuit board. It is therefore possible to provide a terminal connecting structure of flexible board and printed circuit board which securely makes connections at a low cost.

What is claimed is:

1. A terminal connection structure comprising a flexible board and a printed circuit board wherein:

said printed circuit board includes a conductive pattern provided on a surface of said printed circuit board, said conductive pattern comprising a plurality of land portions each having a linear outer shape and a width dimension of 0.6 mm to 0.4 mm, said plurality of land portions being arranged in parallel on the surface of the printed circuit board, each land portion having a solder portion affixed to the full width of the land portion, said solder portion being formed by dipping said printed circuit board into a fused solder so as to adhere the solder portion to the full width of each land portion, each said solder portion extending along an elongated surface of the land portion and having a convex electrical contact surface and a height dimension, wherein the height dimension of the solder portion is controlled by the width dimension of the land portion and the difference in the height dimension between each of the solder portions is 0.1 mm or less;

a resilient member for providing a resilient force when said resilient member is compressed; and a plurality of electrical connecting portions formed on said flexible board, said plurality of electrical connecting portions being arrange as to correspond with the plurality of land portions of said printed circuit board, said resilient member being disposed in a compressed state so as to provide said resilient force to pressure bond said connecting portions to the electrical contact surface of said solder portions of said land portions.

2. A terminal connecting structure comprising a flexible board and a printed circuit board according to claim 1, wherein the plurality of land portions of said printed circuit board are arranged in a zigzag pattern.

3. A terminal connecting structure comprising a flexible board and a printed circuit board according to claim 1, wherein said height dimension of each said solder portion is 0.02 mm to 0.13 mm.

4. A method of forming a terminal connection structure for electrically connecting a flexible board to a printed circuit board, said method comprising the steps of:

a) forming a plurality of land portions on a surface of the printed circuit board, each of the land portions having a linear outer shape and a width dimension of 0.4 mm to 0.6 mm, said plurality of land portions being arranged in parallel on the surface of the printed circuit board;

b) affixing a solder portion to the full width of each land portion, said solder portion being formed by dipping said printed circuit board into a fused solder so as to adhere the solder portion to the full width of each land portion, each said solder portion extending along an elongated surface of the land portion and having a convex electrical contact surface, said electrical contact surface having a height dimension that is controlled by the width dimension of the land portion so that the difference in the height dimension between each of the solder portions is 0.1 mm or less;

c) forming a plurality of electrical connecting portions on said flexible board, said plurality of electrical connecting portions being arranged so as to correspond with the plurality of land portions on said printed circuit board; and d) disposing a resilient member so as to provide a resilient force to pressure bond the connecting portions of said flexible board to the electrical contact surface of the solder portions of said printed circuit board, said resilient force being provided by compressing said resilient member.

5. The method of forming the terminal connecting structure according to claim 4, wherein step a) includes the step of forming the plurality of land portions in a zigzag pattern on the surface of the printed circuit board.

6. The method of forming the terminal connecting structure according to claim 4, wherein step b) includes the step of forming the solder portions so that the height dimension of the electrical contact surface of each said solder portion is 0.02 mm to 0.13 mm.

\* \* \* \* \*